United States Patent [19]

Bertin et al.

[11] Patent Number: 5,270,261
[45] Date of Patent: Dec. 14, 1993

[54] THREE DIMENSIONAL MULTICHIP PACKAGE METHODS OF FABRICATION

[75] Inventors: Claude L. Bertin; Paul A. Farrar, Sr., both of South Burlington; Howard L. Kalter, Colchester; Gordon A. Kelley, Jr., Essex Junction; Willem B. van der Hoeven, Jericho; Francis R. White, Essex, all of Vt.

[73] Assignee: International Business Machines Corporation, Armonk, N.Y.

[21] Appl. No.: 965,728

[22] Filed: Oct. 23, 1992

Related U.S. Application Data

[62] Division of Ser. No. 760,041, Sep. 13, 1991, Pat. No. 5,202,754.

[51] Int. Cl.$^5$ .......................................... H01L 21/60
[52] U.S. Cl. ................................. 437/209; 437/208; 437/225; 437/974; 148/DIG. 135
[58] Field of Search ............... 437/208, 209, 228, 974; 148/DIG. 135

[56] References Cited

U.S. PATENT DOCUMENTS

| | | | |
|---|---|---|---|
| 4,612,083 | 9/1986 | Yasumoto et al. | 437/208 |
| 4,818,728 | 4/1989 | Rai et al. | 437/974 |
| 4,879,258 | 11/1989 | Fisher | 437/974 |
| 4,902,641 | 2/1990 | Koury, Jr. | 437/974 |
| 5,064,771 | 11/1991 | Solomon | 148/DIG. 135 |
| 5,071,792 | 12/1991 | Van Vonno et al. | 437/974 |
| 5,091,331 | 2/1992 | Delgado et al. | 437/974 |
| 5,162,254 | 11/1992 | Usui et al. | 148/DIG. 135 |

*Primary Examiner*—Brian E. Hearn
*Assistant Examiner*—Kevin M. Picardat
*Attorney, Agent, or Firm*—Heslin & Rothenberg

[57] ABSTRACT

A fabrication method and resultant three-dimensional multichip package having a densely stacked array of semiconductor chips interconnected at least partially by means of a plurality of metallized trenches are disclosed. The fabrication method includes providing an integrated circuit chip having high aspect ratio metallized trenches therein extending from a first surface to a second surface thereof. An etch stop layer is provided proximate the termination position of the metallized trenches with the semiconductor substrate. Next the integrated circuit device is affixed to a carrier such that the surface of the supporting substrate is exposed and substrate is thinned from the integrated circuit device until exposing at least some of the plurality of metallized trenches therein. Electrical contact can thus be made to the active layer of the integrated circuit chip via the exposed metallized trenches. Specific details of the fabrication method and the resultant multichip package are set forth.

15 Claims, 8 Drawing Sheets

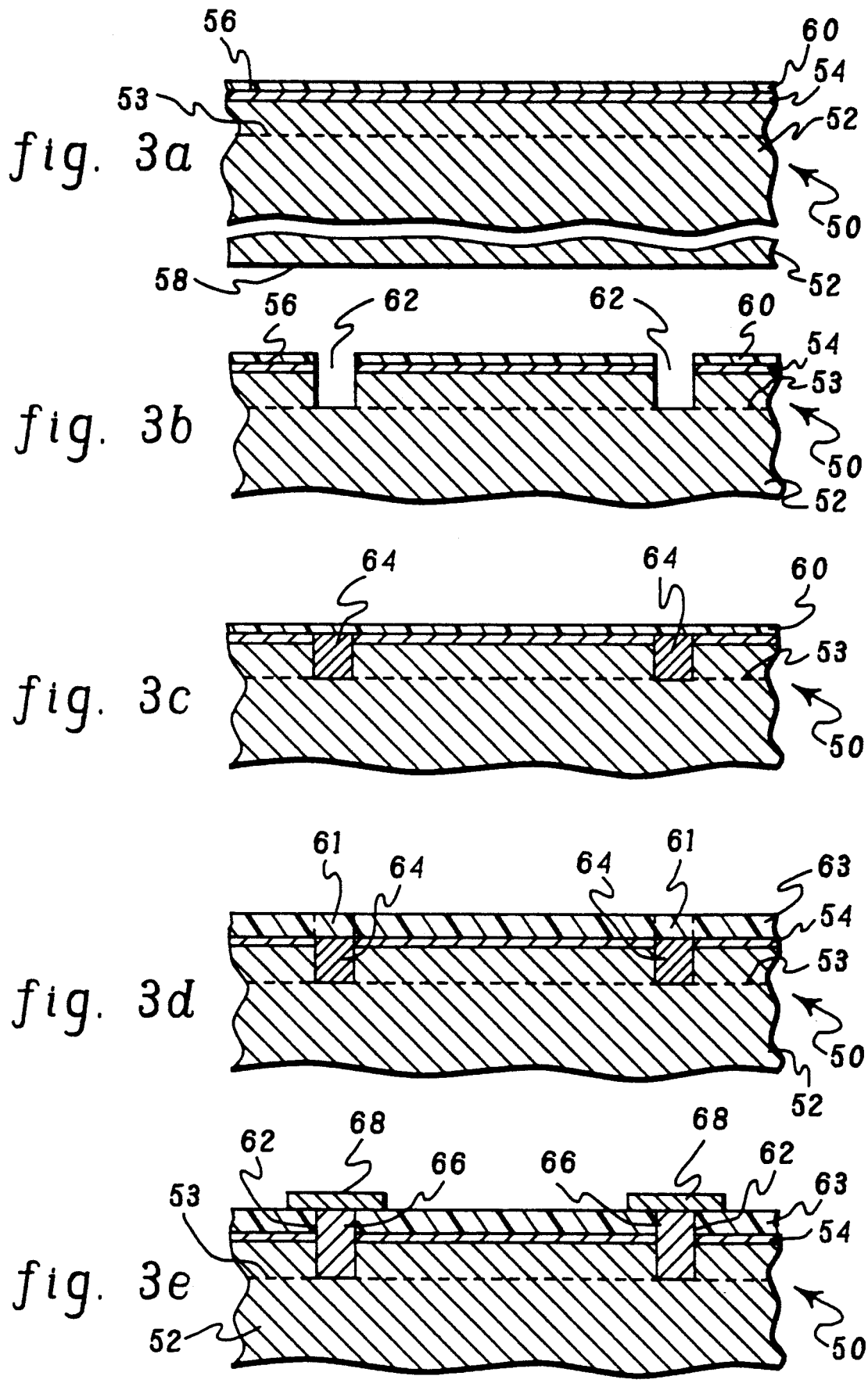

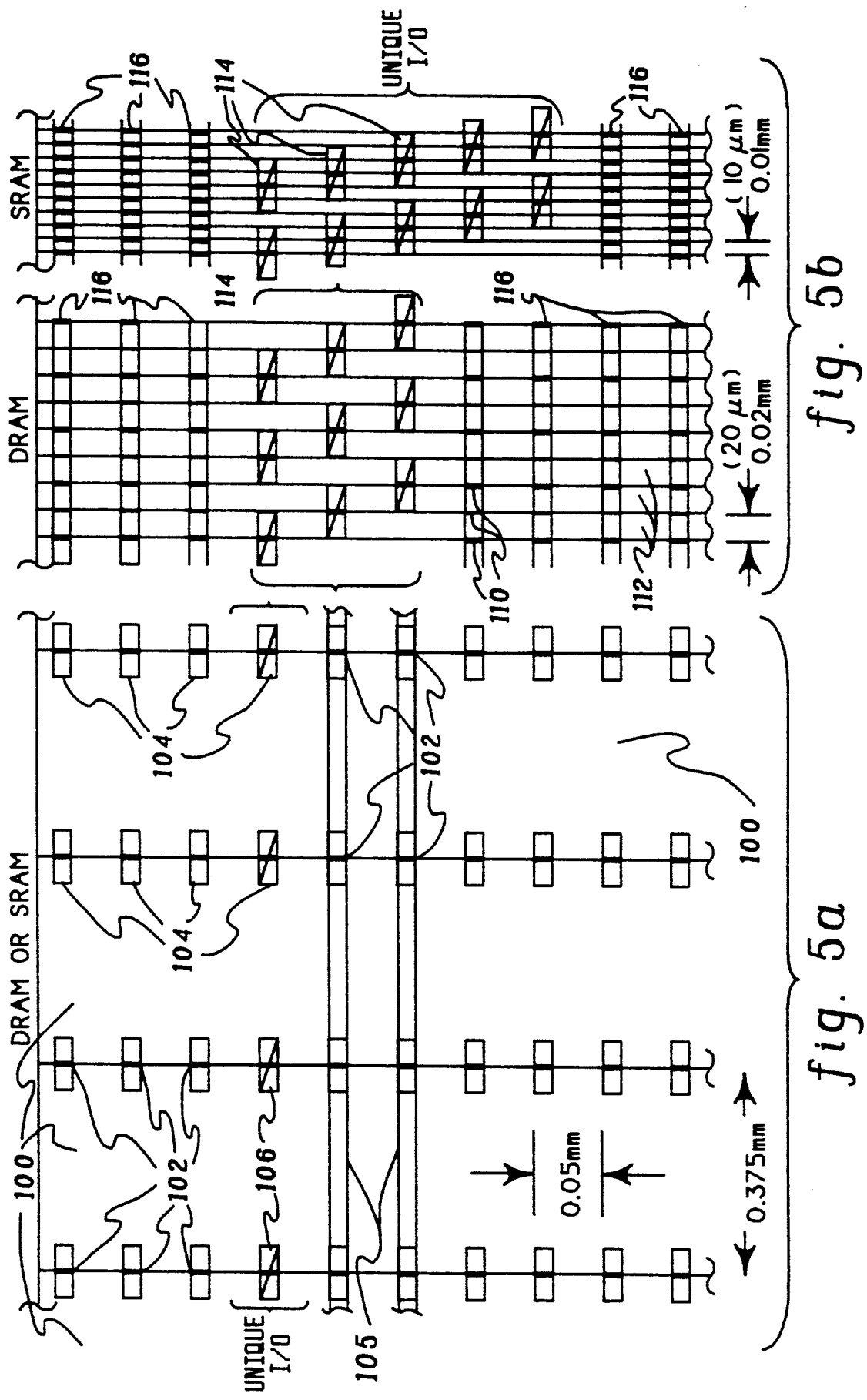

THREE DIMENSIONAL MULTICHIP PACKAGE METHODS OF FABRICATION

This application is a division of application Ser. No. 07/760,041, filed Sep. 13, 1991, now U.S. Pat. No. 5,202,754.

BACKGROUND OF THE INVENTION

1. Technical Field

The present invention relates in general to high density electronic packaging which permits optimization of the number of circuit elements to be included in a given volume. More particular, the present invention relates to a method for fabricating a three-dimensional multichip package having a densely stacked array of semiconductor chips interconnected at least partially by means of a plurality of metallized trenches in the semiconductor chips.

2. Description of the Prior Art

Since the development of integrated circuit technology, computers and computer storage devices have been made from wafers of semiconductor material comprising a plurality of integrated circuits. After a wafer is made, the circuits are typically separated from each other by dicing the wafer into small chips. Thereafter, the chips are bonded to carriers of various types, interconnected by wires and packaged. Along with being time consuming, costly and unreliable, the process of physically attaching wires to interconnect chips often produces undesirable signal delays, especially as the frequency of device operation increases.

As an improvement over this traditional technology, stack or packages of multiple semiconductor chips have become popular, e.g., reference U.S. Pat. No. 4,525,921, entitled "High-Density Electronic Processing Package—Structure and Fabrication." FIG. 1 depicts a typical semiconductor chip stack, generally denoted 10, consisting of multiple integrated circuit chips 12 which are adhesively secured together. A metallization pattern 14 is provided on one or more sides of stack 10 for chip interconnections and for electrical connection to circuitry external to the stack. Metallization pattern 14 includes both individual contacts 16 and bussed contacts 18. Stack 10, with metallization 14 thereon, is positioned on the upper surface 21 of a substrate 20 which has its own metallization pattern 22 thereon. Although superior to the more conventional technique of individually placing chips on a board, substrate or multichip carrier, both in terms of reliability and circuit performance, this multichip stack approach is still susceptible to improvement in terms of density and reduction in the length of chip wiring. Obviously, any improvements in such package characteristics will produce a lower cost, lower power higher density, reliability and thereby providing better performing device.

SUMMARY OF THE INVENTION

Briefly described, the present invention comprises in one aspect a multichip packaging method which includes the initial step of providing an integrated circuit device having a first, upper surface and a second, lower surface in substantially parallel opposing relation. The device, which may comprise a semiconductor chip or wafer, has an active layer adjacent to the first surface and a substrate adjacent to the second surface. The device further includes a plurality of metallized trenches therein which extend from the first surface through the active layer and partially into the substrate. At least some of the plurality of metallized trenches are in electrical contact with the active layer of the integrated circuit device. The packaging method further includes affixing this integrated circuit device to a carrier such that the second surface thereof is exposed, allowing the thinning of the substrate of the integrated circuit device until exposing at least some of the plurality of metallized trenches therein. Electrical contact can thus be made to the active layer of the integrated circuit device via the exposed metallized trenches. Additional integrated circuit devices are preferably added to the stack in a similar manner. As each layer of circuit devices is added electrical contact to at least some of the exposed metallized trenches of the previous layer is made. In another aspect of the present invention, a novel multichip package system, resulting from application of the above processing method, is provided. Specific details of the method and the resultant package are described in detail and claimed herein.

The present invention advantageously produces a multichip package having high integrated circuit density. Wiring solutions are presented for very dense packaging I/O connects, and three-dimensional vertical and horizontal wiring is discussed. Further, techniques to limit the power dissipation of particular functions in a dense multichip package are provided. In accordance with the processing approach of the present invention, a multiple chip package can be created in the same space previously required for a single integrated circuit chip. Further, fabrication of the individual wafers/chips to be assembled into the multichip package remains consistent with high volume wafer manufacturing.

BRIEF DESCRIPTION OF THE DRAWINGS

The subject matter which is regarded as the present invention is particularly pointed out and distinctly claimed in the concluding portion of the specification. The invention, however, both as to organization and method of practice, together with further objects and advantages thereof, may best be understood by reference to the following detailed description taken in conjunction with the accompanying drawings in which:

FIGS. 3a-3i are partial cross-sectional elevational depictions of structures obtained at various processing steps in accordance with one multichip package fabrication embodiment pursuant to the present invention;

FIGS. 5a & 5b illustrate the different requirements in access surface wiring for DRAM and SRAM configurations for a multichip package constructed in accordance with existing techniques (FIG. 5a) and for a multichip package constructed in accordance with the present invention (FIG. 5b)

DETAILED DESCRIPTION OF THE INVENTION

Figure 1:
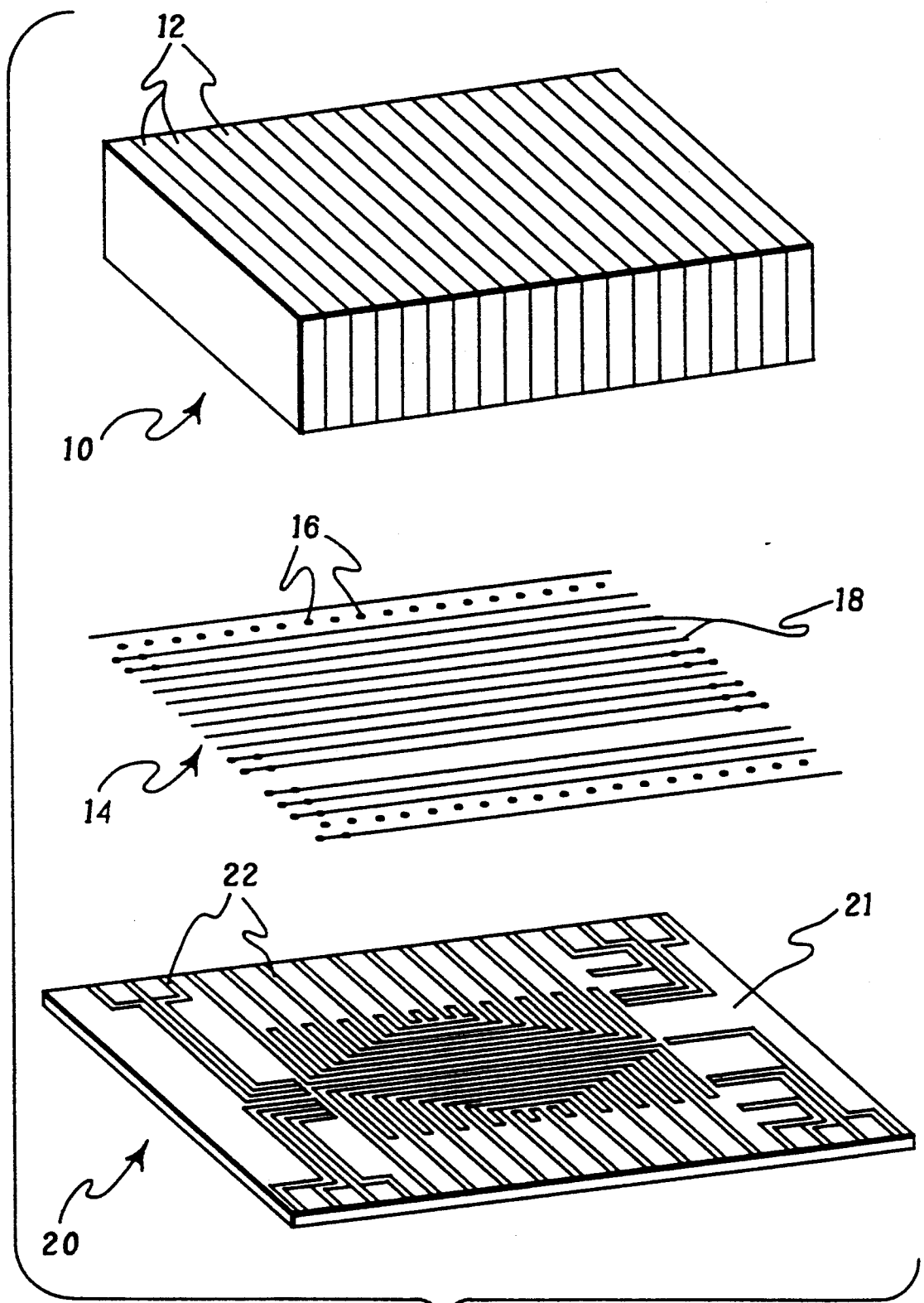
FIG. 1 is an exploded perspective view of a basic prior art multichip package.
Figure 2A:
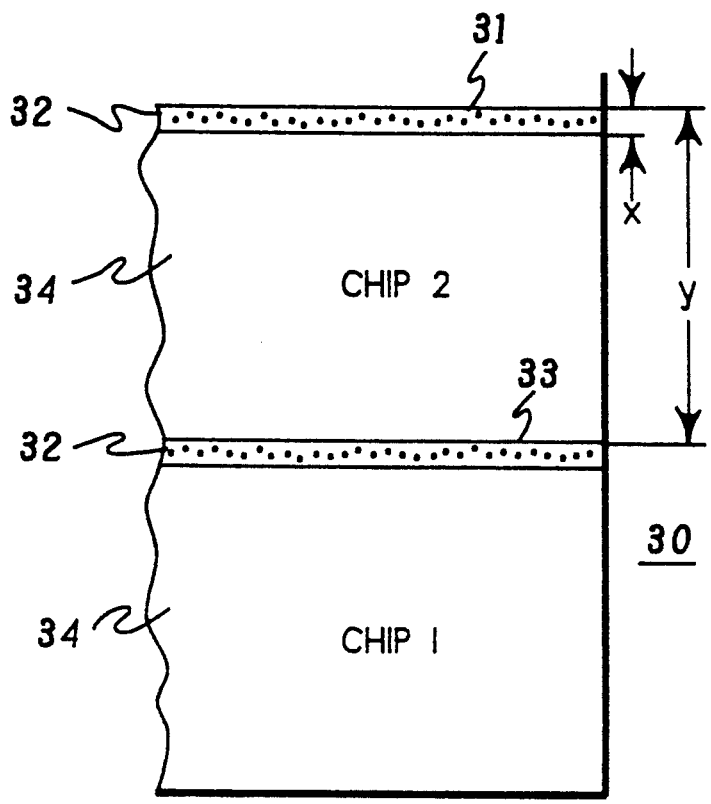
FIGS. 2a & 2b illustrate the difference in packaging density between a multichip package fabricated in accordance with existing techniques (FIG. 2a) and a multichip package fabricated pursuant to the present invention (FIG. 2b)

Broadly stated, the present invention comprises a method for improving the circuit density in a multichip package, such as stack 10 depicted in FIG. 1. FIG. 2a depicts a conventional multichip stack 30 having two chips, chip 1 and chip 2. Each chip has an active layer 32 which extends within the chip a distance "x", and an overall thickness "y" from an upper surface 31 to a lower surface 33 thereof. Chip thickness "y" is at least an order of magnitude greater than active layer thickness "x". For example, typically thickness "x" is within the range of 5–20 micrometers, while thickness "y" is more conventionally in the range of 750–850 micrometers (30 mils). However, recently the practice is to reduce thickness "y" by mechanical thinning of the substrate in each chip to approximately 375–425 micrometers (15 mils) prior to assembly of the package. Notwithstanding this mechanical reduction, the volume of the useful active silicon, e.g., active layers 32, remains much less than that of the total silicon. This is because the silicon substrate still continues to be used for mechanical support of layer 32 of the chip during processing.

Figure 2B:
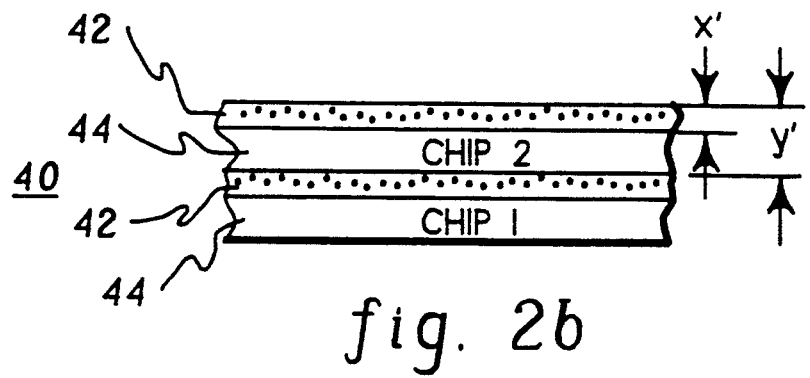

In comparison with the package of FIG. 2a, the semiconductor chips in a package processed pursuant to the present invention have only a thin layer of substrate for support of the active layer, which is illustrated in FIG. 2b wherein two thin semiconductor chips, chip 1 and chip 2, are shown. These chips are stacked in a package 40. The active layer 42 of each chip in package 40 has a thickness "x'" which, as shown, is a significant portion of the chip thickness "y'". This is in contrast to the large size disparity between thickness "x" and thickness "y" for the conventional package of FIG. 2a. By way of example, thickness "x'" may be in the 5–20 micrometers range, while the overall thickness "y'" of each device may be only 20 micrometers or less. This means that when the chips are combined in a stack configuration a significantly denser electronic package is produced than is possible using previous stacking techniques for separate integrated circuit chips. In essence, processing in accordance with the present invention advantageously eliminates most of the excess silicon substrate in a silicon device after bonding of the device to a growing multichip package.

One example of a package fabrication process pursuant to the present invention is described below with reference to FIGS. 3a–3i.

Referring first to FIG. 3a, processing begins with a semiconductor device 50 (preferably comprising a wafer) having a substrate 52 and an active layer 54, which is typically positioned at least partially therein. (Layer 54 may be totally or partially defused into substrate 52 and/or partially or totally built up from substrate 52 using conventional semiconductor processing techniques known to those skilled in the art.) Layer 54 is adjacent to a first, upper planar surface 56 of device 50. A second, lower planar surface 58 of device 50 is positioned substantially parallel to first planar surface 56. A dielectric layer 60, for example, SiO$_2$, is grown over active layer 54 of device 50. Although variable, substrate 52 thickness will typically be approximately 750–850 micrometers (15 mils) prior to creation of a multichip package. In comparison, the thickness of active layer 54 may be in the range of 4–6 micrometers, while the thickness of insulating layer 60 will vary, e.g., with the number of metallization levels already built upon active layer 54. Layer 54 may comprise any conventional bipolar, CMOS, NMOS, PMOS, etc., circuitry.

Pursuant to the invention, a standard wafer is modified during manufacture by placing a buried etch stop 53 below the surface of the substrate. The etch stop can comprise an N+layer 53 in a P substrate 52 or a P+ layer 53 in an N substrate 52, both of which can be fabricated by any one of several means known to those skilled in the art.

Shown in exaggerated size in FIG. 3b are thin, deep trenches 62 defined in integrated circuit device 50. Trenches 62 are configured to extend slightly through etch stop layer 53 into substrate 52. In a preferred embodiment, deep trenches 62 will each have a high aspect ratio of approximately 20:1, which means, for example, that thin trenches 62 will preferably have a width of 1 micrometer for a 20 micrometer deep trench. (As described below, the high aspect ratio trenches 62 will ultimately advantageously serve to define very small interconnect dimensions.) Trenches 62 can be fabricated pursuant to the techniques described in U.S. Pat. No. 4,717,448, entitled: "Reactive Ion Etch Chemistry for Providing Deep Vertical Trenches in Semiconductor Substrates," which is hereby incorporated herein by reference. Deep trenches 62 are positioned in the integrated circuit device 50 where electrical through connections between devices are desired once the multichip package is assembled.

The trench sidewalls are oxidized to provide isolation from the bulk silicon (such that the trenches can be used for wiring without shorting the devices), with doped polysilicon or other conductor 64 (see FIG. 3c). The device, including wiring levels, can next be completed using standard processing techniques, with the layout of the devices (circuits) being modified so that the area 61 (see FIG. 3d) where polysilicon filled trenches are positioned remains clear of circuitry and wiring embedded within completed oxidation/connecting metallization layer 63.

Referring to FIG. 3e, deep trenches 62 are next reetched to remove polysilicon plugs 64, using techniques known in the art. The trenches 62 are then filled with an appropriate metal 66, e.g., tungsten Au, Cu, aluminum or other suitable metal, by a chemical vapor deposition CVD process, plating or other appropriate means. Metallized trenches 66 will extend at least slightly through etch stop layer 53. Contact pads 68 of gold, copper or other appropriate metal are then deposited so that they will interconnect the appropriate wiring (not shown) on the chip to the vertically disposed wiring 66 in trenches 62. The integrated circuit chips are then tested, the wafers diced and the good chips are selected. Alternatively, the wafers may be left undiced depending upon the processing path chosen. If sufficient redundancy is built into the structure so as to produce essentially a 100% yield of good chips then the wafers will remain undiced. Whether the wafers are to be diced or remain undiced, however, they are preferably first mechanically thinned, for example, to at least 375–400 micrometers (15 mils) i.e., if not already accomplished.

Figure 3F:
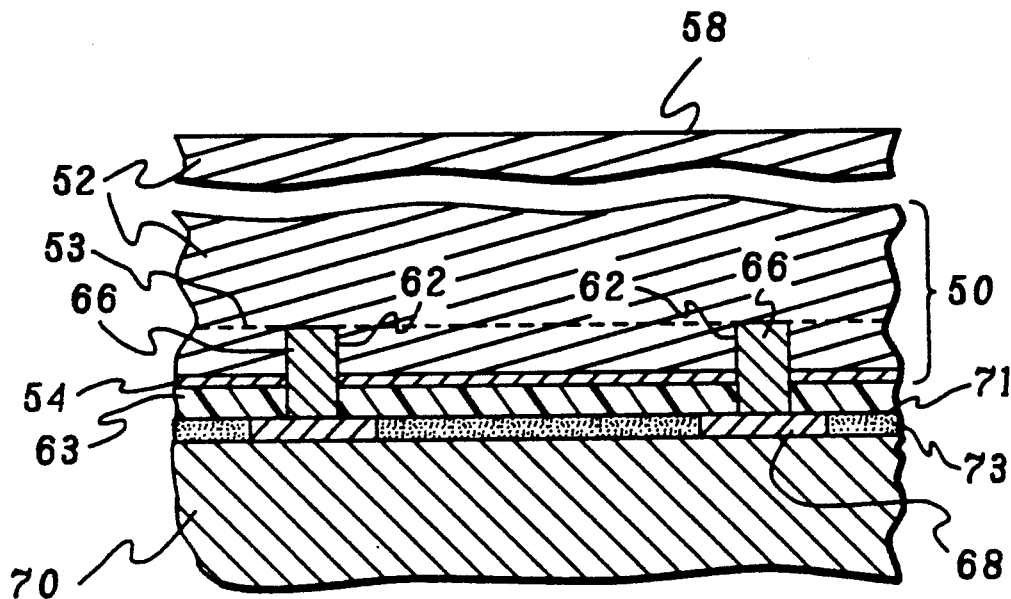

Assuming that the chips are separated, the first integrated circuit chip 50 to be incorporated into the multichip package is flipped over and bonded to a suitable carrier 70 such that the protective surface 63 of chip 50 is disposed adjacent the upper surface 71 of carrier 70 (see FIG. 3f). Chip 50 is adhesively bonded to carrier 70 by use of a suitable adhesive material 73, such as a polyimide. (As an alternative to carrier 70, chip 50 could be bonded to a base integrated circuit chip (not shown) which would have contacts mirroring the positions of pads 68 of device 50 and a thickness sufficient to support the package, at least during assembly. Joining of integrated circuit chip 50 to such a base chip could be by Au to Au thermal compression bonding or other suitable means.)

Figure 3G:
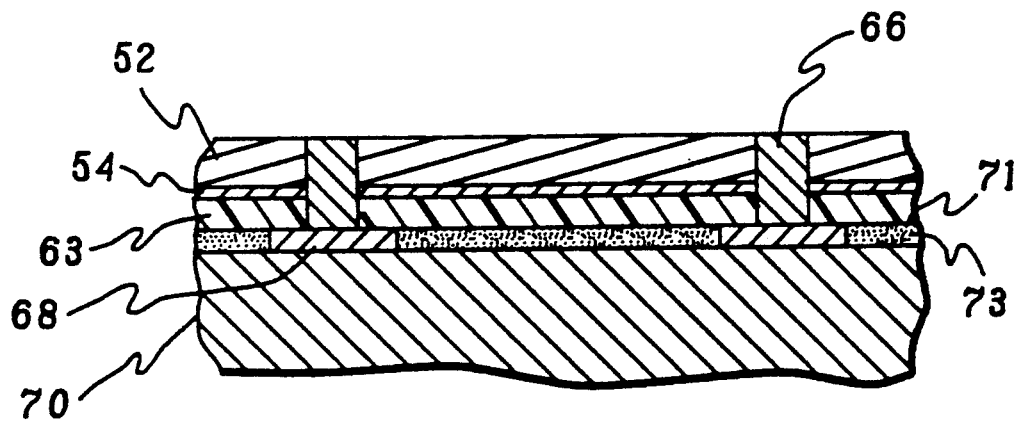
Figure 3H:
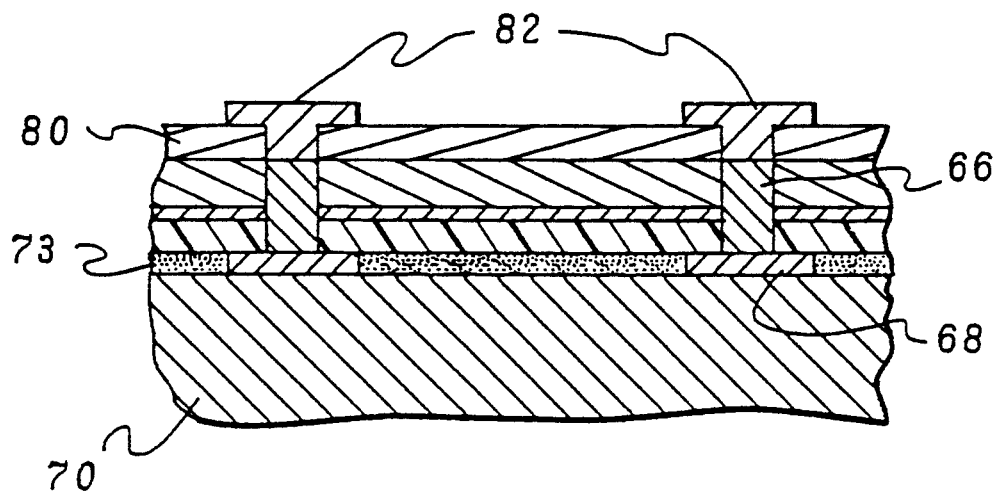
Figure 3I:
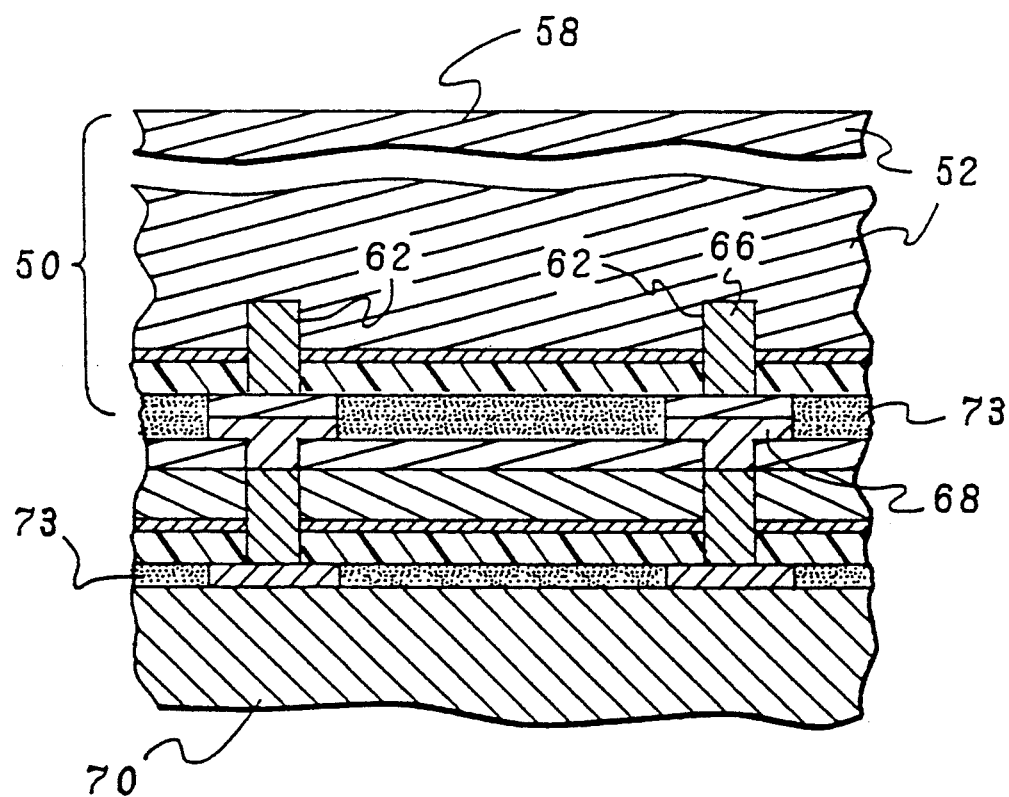

Next, the exposed second surface 58 of chip 50 (FIG. 3f) is etched in a suitable selective chemical etch such as ethylenediamine, pyrocatechol, water solution, or 200:1 nitric acid/HF solution. See copending U.S. Patent Application entitled "Three Dimensional Semiconductor Structure Formed from Planar Layers," Ser. No. 656,902, filed Feb. 15, 1991, Continuation of Ser. No. 427,679, filed Oct. 26, 1989. The chemical etch is selective so that etching ceases when etch stop layer 53 is reached (FIG. 3g). Further, the etchant is selected so as not to etch metal 66 deposited within deep trenches 62. The chemical etch removes only the silicon wafer down to etch stop 53 (see FIG. 3g). As shown in FIG. 3h, an appropriate photo-definable polyimide 80 or other bonding compound is then applied and etched to partially reveal the metallized trenches 66 in chip 50. Prior to complete curing of the polymer, Au is plated electrolessly and selectively on the metallized trench connections to form pads 82. If aluminum is used to metallize the trenches, a suitable diffusion barrier (not shown), such as Cr, is plated on the Al prior to Au plating. The stacking process is repeated by the respective addition of integrated circuit devices (see, e.g., FIG. 3i) one on top of the other, each having its active layer positioned adjacent to the last thinned exposed surface of the stack with contact pads 68 contacting at least some of the exposed metallized trenches 66 therein. Bonding of each chip layer is such that the polymer and Au to Au bonding preferably take place simultaneously.

Should full wafer stacking be used, the process is essentially the same. The wafers are subsequently diced into separate multichip packages at an appropriate point in the process, either when the package is complete or when the cumulative yield is such as to make further stacking uneconomical.

It will be observed that a significant advantage is attained pursuant to the fabrication process set forth, i.e., the elimination of excess silicon substrate material from the separately constructed integrated circuit devices as the multichip package is assembled, without interfering with the active silicon layers thereon. The removed silicon is single crystal silicon and the fabrication of individual integrated circuit devices remains consistent with high volume semiconductor wafer manufacturing. As described below, multichip packages constructed pursuant to this processing technique achieve the greatest possible silicon volumetric density for separately fabricated integrated circuit devices. The device thicknesses are adjusted to more closely reflect the active surface and depth actually used so that package density is more closely linked to feature depth.

Figures 4A, 4B:
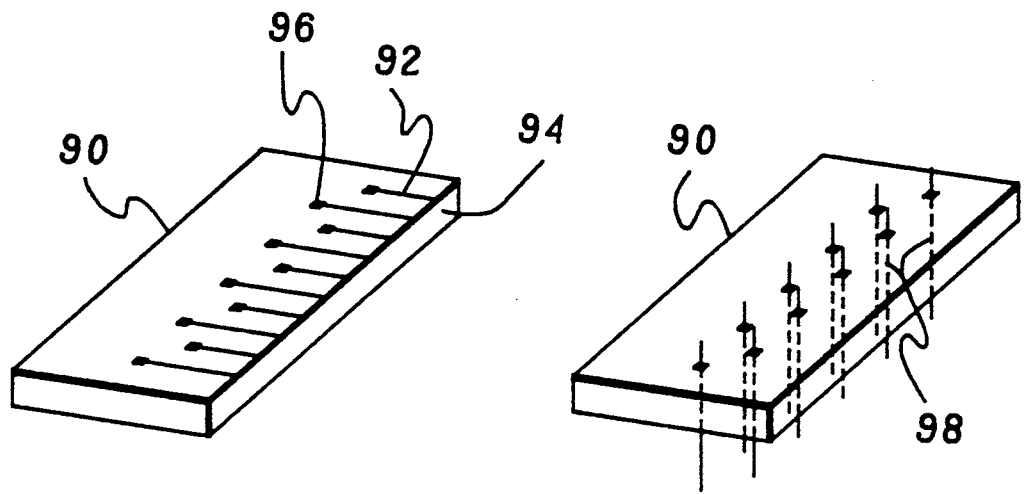
FIGS. 4a-4d depict various electrical lead wiring options from or through an integrated circuit device pursuant to the present invention.

FIGS. 4a-4d depict several examples of integrated circuit chip connection options for a multichip package constructed pursuant to the present invention. In FIG. 4a, horizontal connecting leads 92 extend to a planar side surface 94 of chip 90 to provide electrical connection between side surface 94 and selected pads 96 on the surface of chip 90. Once multiple chips are assembled in a stack, at least some of which may include horizontal extending leads 92, a pattern of metallization can be deposited on the edge surface of the stack to define connects to individual electrical pads in the chip, and/or multiple selected electrical pads located on one or more of the integrated circuit chips.

Figures 4C, 4D:
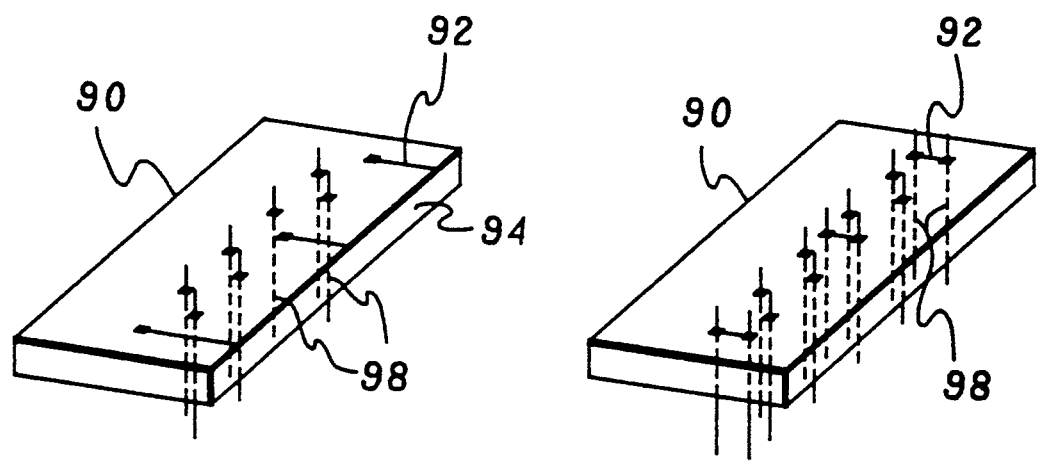

By utilizing the metallized trench approach of the present invention, multiple layers of integrated circuit chips, such as chip 90, can be vertically interconnected via metallized trenches, e.g., trenches 98 in FIG. 4b. Trenches 98, constructed as described above in connection with FIGS. 3a-3i, are positioned to extend through the respective chip 90. Alternatively, a mixture of vertically and horizontally extending interconnecting leads can be used. In such a mixed interconnecting circuitry application, the horizontal leads 92 can extend to one or more edge surfaces 94 of the chip 90 (FIG. 4c), and/or only extend between selected pads in a single chip (FIG. 4d). The scale of wirability between integrated circuit chips in the multichip package is believed to comprise a significant improvement over state of art package wiring. The dimensions of the vertical interconnections between integrated circuit chips are at least an order of magnitude smaller than any prior "gross" vertical connection wiring technique.

One factor to consider in devising a horizontal/vertical interconnection scheme is the amount of space that will be available on the edge surfaces of the completed multichip package. FIG. 5a partially depicts several semiconductor chips 100 arranged in a conventional multichip package. Each chip 100 has several electrical leads 102 extending therefrom to at least one side surface of the package. Traditionally, T-shaped electrical junctions are formed in the access plane (i.e., at least one planar side surface of the multichip package having the pattern of chip interconnecting metallization thereon (not shown)), to provide good electrical junctions with the leads brought out to that side surface from the respective integrated circuit chips 100. This is accomplished by depositing conductor pads 104 of uniform size on top of the access plane so that each pad intersects with an end of an electrical lead 102 brought out from the respective integrated circuit chips 100.

In many applications, planar side wiring is in the form of stripes (or buses) 105 extending perpendicular to the planes of the chips. Each stripe 105 crosses the junctions between a plurality of chips where it makes electrical contact with the T-shaped junctions on the chips. In many other applications, unique I/O junctions 106 are required for making individual contacts on separate integrated circuit chips 100. In the multichip DRAM, SRAM, EPROM, or other integrate circuits or combination thereof package of FIG. 5a, sufficient space is available on the chips for readily providing these I/O contacts 106 within the access plane. For example, typical spacing between adjacent T-junctions of the same integrated circuit chip is approximately 0.05 millimeters (2 mils), while T-junction spacing between adjacent chips is approximately 0.375 millimeters (15 mils).

Examples of access plane sizing for both DRAM and SRAM multichip packages assembled pursuant to the present invention are depicted in FIG. 5b. As shown, the spacing between electrical leads 110 brought out from adjacent integrated circuit chips 112 in both DRAM and SRAM configurations is significantly reduced from the spacing between these leads in FIG. 5a. For example, in a DRAM application, such spacing may be approximately 20 micrometers (0.02 millimeters) and for a SRAM application, spacing may drop down to 10 micrometers (0.01 millimeters). In order to form discrete I/O contact pads 114, therefore, it is necessary to spread out laterally the T-shaped electrical junctions to allow room for the unique I/O contacts. This in turn limits the number of stripes (or buses) 116 which can extend perpendicular to the planes of the integrated circuit chips.

The invention overcomes this problem by utilizing the metallized trenches for bussing. That is, in addition to forming simple chip-to-chip interconnections, the trenches can be arranged to provide bussing between non-adjacent chips. In effect, we have added an additional wiring plane that reduces the constraints imposed by the thinness of the chips on chip edge wiring. In designing chips for the cube of the invention, circuit placement etc. must be optimized for through-chip wireability. However, the resulting decrease in circuit density is more that compensated by introducing an entirely new wiring plane. The invention will actually enhance performance, because now each circuit can be only 30 μm (the thickness of arranged on an abutting chip, as opposed to up to 3000 μm distant from interdependent circuitry on the same chip. So, instead of designing each chip independently, circuits can be placed on different chips to reduce transmission delays by the stacking and through-chip wiring techniques of the invention.

Figure 6:
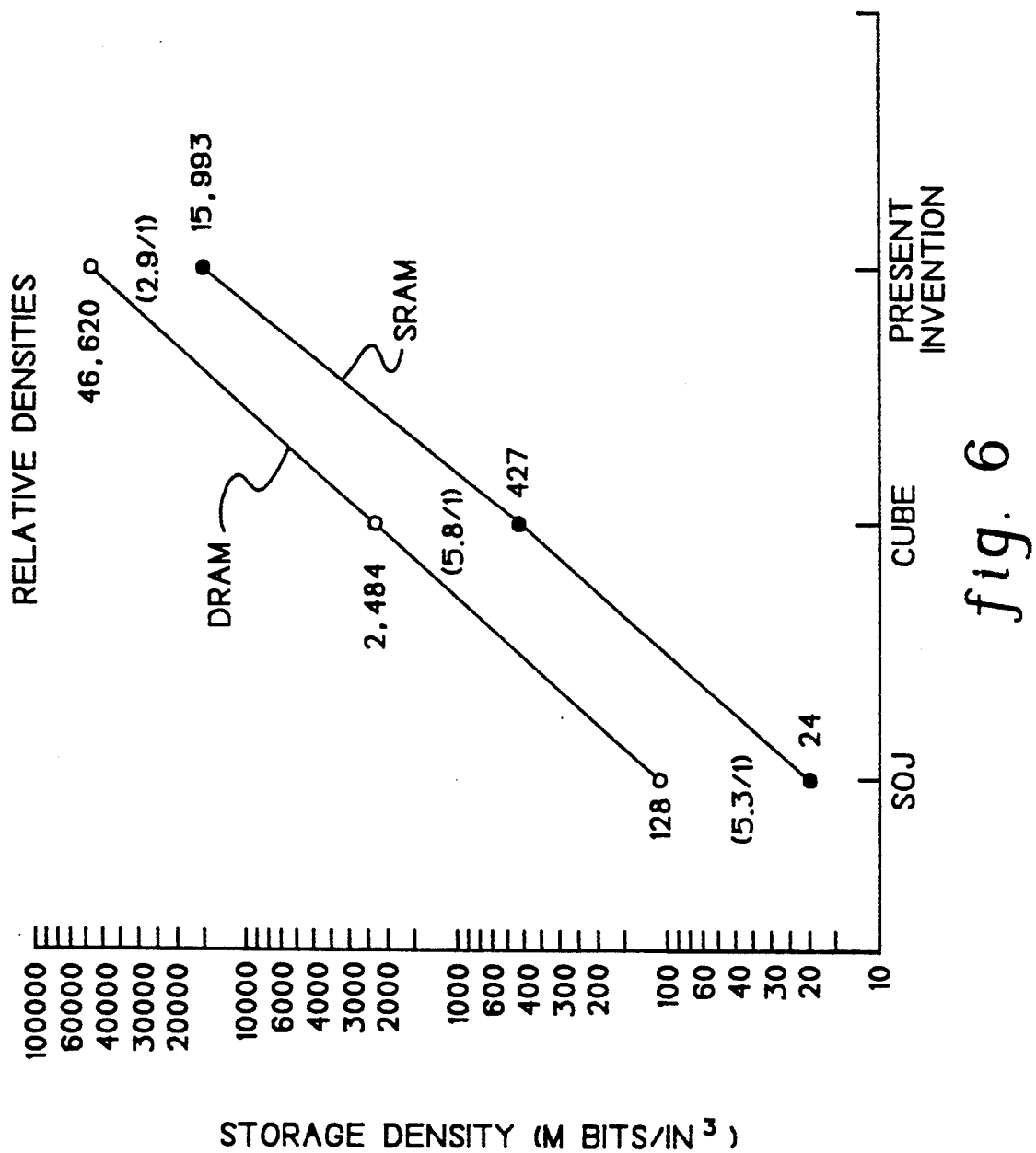
FIG. 6 graphically depicts an example of the different integrated circuit packaging densities obtainable using Small Outline J Lead (SOJ), Cube (FIG. 1) and that produced in the present invention packaging techniques.

Table 1 and FIG. 6 set forth an example of the significant density advantages obtained by constructing a multichip module in accordance with the present invention.

TABLE 1

| Package Type | DRAM Density (MBITS/in3) | Ratio | SRAM Density (Mbits/in3) | Ratio | DRAM/SRAM Ratio Storage Density |
|---|---|---|---|---|---|
| SOJ | 128 | 1 | 24 | 1 | 5.3/1 |
| Center | 2,484 | 19 | 427 | 18 | 5.8/1 |
| Pico-Cube | 346,620 | 364 | 15,993 | 666 | 2.9/1 |

In this example, the first package comprises DRAM or SRAM chips assembled with SOJ technology, the second package comprises DRAM or SRAM chips mounted in a "Cube" using technology such as that described in U.S. Pat. No. 4,525,921, entitled "High-Density Electronic Processing Package—Structure and Fabrication," and the third package comprises DRAM or SRAM chips mounted in an assembly pursuant to the present invention. The configurations used were a 4 MBit DRAM scaled from 0.8–0.6 micrometer Ground Rules (G.R.) and a 1 Mbit SRAM in 0.6 micrometer G.R. For both DRAMs and SRAMs, the Cube packaging produced a density improvement of more than an order of magnitude over the SOJ package, while the present invention improved storage density by more than two orders of magnitude over the SOJ package.

For the present invention the active surface depth effects the final packaging leverage. A DRAM package with a 10 micrometer depth for metallized trenches plus the surrounding region, requires 20 micrometers with a guardband. In comparison, a SRAM package, with 1–2 micrometers for devices, is assumed to need no more than 10 micrometers in total depth. The storage density of SRAM packages improves significantly for present invention technology in comparison with that obtainable with SOJ or Cube approaches. This is an indication that the ultimate silicon density is being approached using the present invention.

Another measure of storage density leverage is to estimate the storage density for packages of approximately the same height. Assuming a package height equal to the package width, then for a DRAM that is 8.98 millimeters, a two chip high SOJ is 7.12 millimeters. Further assuming that both the Cube and Present invention packages will be approximately square, then the following functional comparison (as shown in Table 2) for 4M DRAMs can be obtained:

TABLE 2

| Package Type | Storage Density |
|---|---|
| 2 Chip (SOJ) | 1MByte |
| 32 chip (Cube) | 16MByte |
| 512 chip (Invention) | 256Mbyte |

One further consideration to be addressed in connection with the present invention is that the power dissipation per unit volume increases with packaging density. Clearly, a multichip package fabricated pursuant to the present invention will have a greater power density than most previous multichip packages. Also, since not all chips are selected at a given time, standby power is extremely important. For example, in a DRAM package, perhaps only 1/16 or 1/32 chips may be selected for particular applications. Therefore, reducing standby power can be very significant.

One possible technique to lowering power dissipation is to improve retention time and reduce refresh requirements. Also, with high densities, Flash-EPROM chips can be added to the stack so that address locations which change infrequently can have zero power dissipation data stored in Flash-EPROM cells.

Lastly, a multichip package constructed pursuant to the present invention is compact and a good thermal conductor. The package could be cooled with a cold tip and should be consistent with low temperature operation, e.g., in liquid nitrogen.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method for packaging an integrated circuit device, said method comprising the steps of:
   (a) providing an integrated circuit device having a first, upper surface and a second, lower surface, said device having an active layer adjacent said first surface and a substrate adjacent said second surface, said integrated circuit device further including a plurality of metallized trenches therein extending from said first surface through said active layer and only partially into said substrate, at least some of said plurality of metallized trenches being in electrical contact with the active layer of said integrated circuit device;

(b) affixing said integrated circuit device to a carrier such that said second surface is exposed and such that said active layer is protected; and (c) thinning said substrate of the integrated circuit device until exposing said plurality of metallized trenches therein, whereby electrical contact to the active layer of said integrated circuit device can be provided via said exposed metallized trenches.

2. The packaging method of claim 1, further comprising the steps of:

(d) providing an additional integrated circuit device having a first surface and a second surface, said additional integrated circuit device having an active layer adjacent said first surface and a substrate adjacent said second surface, said additional integrated circuit device further including a plurality of metallized trenches therein extending from said first surface through said active layer and only partially into said substrate, at least some of said plurality of metallized trenches being in electrical contact with the active layer of said additional integrated circuit device;

(e) affixing said additional integrated circuit device to the exposed surface of the last thinned integrated circuit device such that said active layer of said additional integrated circuit device and/or said plurality of metallized trenches of said additional integrated circuit device are electrically coupled to at least some of the exposed metallized trenches of the last thinned integrated circuit device, and such that said second surface of said additional integrated circuit device is exposed; and (f) thinning substrate from the exposed additional integrated circuit device until exposing at least some of said metallized trenches therein, whereby electrical contact to the active layer of said additional integrated circuit device can be provided via said exposed metallized trenches.

3. The packaging method of claim 2, further comprising the step of repeating said steps (d)-(f) a plurality of times such that said multi-device package includes a plurality of electrically interconnected, thinned integrated circuit devices therein.

4. The packaging method of claim 2, wherein prior to said affixing step (e) said method further comprises the step of:

(g) metallizing the exposed surface of the last thinned integrated circuit device so as to electrically connect to at least some of said exposed metallized trenches in said substrate, said exposed surface metallization including forming interconnection pads on said insulating layer for facilitating electrical connection between the metallized trenches of said thinned integrated circuit device and said additional integrated circuit device provided in step (d).

5. The packaging method of claim 4, further comprising the step of repeating steps (d)-(g) a plurality of times such that said multichip package includes a plurality of electrically interconnected, thinned integrated circuit devices therein.

6. The packaging method of claim 3, wherein each of said integrated circuit device affixing steps (e) includes adhesively bonding said additional integrated circuit device to the last thinned integrated circuit device in the package.

7. The packaging method of claim 3, wherein said integrated circuit devices each comprise a semiconductor wafer having multiple integrated circuits thereon, and said method further includes the step of dicing said multiple wafer package into separate multichip packages.

8. The packaging method of claim 1, wherein said carrier comprises a base integrated circuit device, said base device having a first surface and a second surface in substantially parallel opposing relation, said base device having an active layer adjacent said first surface and a substrate adjacent said second surface, and wherein said affixing step (b) includes affixing said integrated circuit device of step (a) to said base integrated circuit device such that the active layers of said devices are electrically coupled.

9. The packaging method of claim 1, wherein said providing step (a) further includes the steps of:

forming trenches in said integrated circuit device extending from said first surface through said active layer and only partially into said substrate; and metallizing said trenches formed in said integrated circuit device.

10. The packaging method of claim 9, wherein before said step of metallizing said trenches, an electrical insulator is formed on sidewalls of said trenches within said substrate.

11. The packaging method of claim 9, wherein said trench forming step includes forming said trenches to be less than thirty micrometers in depth from said first surface of said chip.

12. The packaging method of claim 1, wherein said thinning step (c) includes chemically removing said exposed substrate.

13. The packaging method of claim 12, wherein said thinning step (c) includes mechanically removing said substrate prior to said step of chemically removing substrate from said exposed surface.

14. The packaging method of claim 13, wherein said step of mechanically removing substrate proceeds until said substrate is less than 400 micrometers thick.

15. The packaging method of claim 12, wherein the substrate of said integrated circuit device includes a buried etch stop layer and wherein said thinning step (c) includes chemically removing the exposed substrate until reaching said buried etch stop layer.

* * * * *